United States Patent [19]
Mittal et al.

[11] Patent Number: 5,777,514
[45] Date of Patent: Jul. 7, 1998

[54] DIFFERENTIAL TO SINGLE ENDED CONVERSION TECHNIQUE FOR AN OPERATIONAL AMPLIFIER HAVING LOW INPUT OFFSET VOLTAGE, HIGH SPEED AND HIGH GAIN

[75] Inventors: Rohit Mittal, Milpitas; Carlos Alberto Laber, Los Altos, both of Calif.

[73] Assignee: Micro Linear Corporation, San Jose, Calif.

[21] Appl. No.: 721,910

[22] Filed: Sep. 27, 1996

[51] Int. Cl.$^6$ .................................. H03F 3/45; H03F 3/16
[52] U.S. Cl. ............................................ 330/253; 330/300
[58] Field of Search ................................ 330/9, 252, 253, 330/255, 300, 259, 260, 261

[56] References Cited

U.S. PATENT DOCUMENTS

| | | | |
|---|---|---|---|
| 4,371,843 | 2/1983 | Fang et al. | 330/255 X |
| 4,555,673 | 11/1985 | Huijsing | 330/258 |
| 4,595,883 | 6/1986 | Nakayama | 330/255 |
| 4,661,779 | 4/1987 | Okamoto | 330/253 |
| 4,701,718 | 10/1987 | Wrathall et al. | 330/253 |
| 4,730,168 | 3/1988 | Senderowicz et al. | 330/253 |
| 4,897,611 | 1/1990 | Laber et al. | 330/253 |
| 5,001,441 | 3/1991 | Gen-Kuong | 330/294 |
| 5,028,882 | 7/1991 | Marrah et al. | 330/254 |
| 5,146,152 | 9/1992 | Jin et al. | 323/280 |
| 5,218,319 | 6/1993 | Takimoto | 330/257 |
| 5,365,161 | 11/1994 | Inoue et al. | 323/282 |
| 5,559,470 | 9/1996 | Laber et al. | 330/252 |

OTHER PUBLICATIONS

Gray, Paul R., and Meyer, Robert G., *Analysis and Design of Analog Integrated Circuits*, Third Ed., 1993, pp. 471–472.
Laber, et al., "Design Considerations for a High–Performance 3–um CMOS Analog Standard–Cell Library," IEEE Journal of Solid State Circuits, vol. SC–22, No. 2, Apr. 1987, pp. 181–189.

*Primary Examiner*—Steven Mottola
*Attorney, Agent, or Firm*—Haverstock & Owens

[57] ABSTRACT

An operational amplifier having an input and an output stage. The input stage includes first and second source-coupled NMOS input transistors for accepting a differential input voltage and first and second PMOS load transistors for supplying current to each input transistor. A node between the first input transistor and first load transistor is coupled to a gate of a third PMOS transistor having its source coupled to a positive supply and its drain coupled to the sources of the input transistors and to a negative supply through a first biasing transistor. The output stage includes a fourth PMOS transistor having its gate coupled to a node between the second input transistor and the second load transistor and a source coupled to the positive supply voltage. A drain of the output transistor forms an output node and is coupled to the negative supply through a second biasing transistor. To minimize the input offset voltage, a ratio of the width-to-length of the third PMOS transistor to the width-to-length of the fourth PMOS transistor equals to a ratio of a quiescent drain current in the third PMOS transistor to a quiescent drain current in the fourth PMOS transistor. The load transistors have relatively large lengths for high gain while the third and fourth PMOS transistors have small lengths for high speed. Therefore, the operational amplifier has low input offset voltage, high speed and high gain.

36 Claims, 4 Drawing Sheets

DIFFERENTIAL TO SINGLE ENDED CONVERSION TECHNIQUE FOR AN OPERATIONAL AMPLIFIER HAVING LOW INPUT OFFSET VOLTAGE, HIGH SPEED AND HIGH GAIN

FIELD OF THE INVENTION

The invention relates to the field of operational amplifiers. More particularly, the invention relates to a differential to single ended conversion technique for operational amplifiers having low input offset voltage, high speed, high gain and minimal device sizes.

BACKGROUND OF THE INVENTION

Operational amplifiers are utilized extensively as basic building blocks in the design of electric circuits. Ideally, an operational amplifier has differential inputs, infinite input resistance, a single-ended output, zero output resistance, infinite gain and infinite bandwidth. Practical operational amplifiers, however, do not achieve these ideal characteristics. Instead, the prior art discloses a number of operational amplifiers, each having different performance parameters. Generally, such practical operational amplifiers emphasize one or more performance parameters at the expense of others. Based upon the performance parameters, and other factors, such as cost and complexity, an appropriate operational amplifier can be selected for a particular circuit application.

An important performance parameter of an operational amplifier is its speed or bandwidth. A high speed allows the output of the operational amplifier to respond quickly to changes in input. Thus, an operational amplifier having a high speed can be utilized in a circuit for processing high frequency signals. Another important performance parameter of an operational amplifier is its open loop gain. An operational amplifier having sufficiently high open loop gain can be advantageously utilized in a closed loop circuit for processing low level signals.

Yet another important performance parameter of an operational amplifier is its input offset voltage. The input offset voltage of an operational amplifier is the amount of voltage that must be applied across the input terminals to achieve an output voltage of zero volts and is representative of an amount of error in the output voltage. Ideally, the input offset voltage is zero volts. This, however, is difficult to achieve in practical operational amplifiers. An input offset voltage can be caused by flaws in the layout or design of an operational amplifier or by random variations or mismatches in the individual devices that comprise the operational amplifier. Because layout and design flaws can be corrected, random variations and mismatches are of concern. For example, limited resolution of a photolithographic process utilized in manufacturing an integrated circuit will contribute to random variations in device dimensions and, thus, random variations in device parameters. This is especially true when device dimensions are small in comparison to the resolution of the photolithographic process.

FIG. 1 illustrates a schematic diagram of a prior art operational amplifier. A differential input voltage is applied across the gates of NMOS transistors M1 and M2. The drain of the transistor M1 is coupled to the drain of a PMOS transistor M3, to the gate of the PMOS transistor M3 and to the gate of a PMOS transistor M4. The drain of the transistor M2 is coupled to the drain of the transistor M4. A positive supply voltage VDD is applied to the source of the transistor M3 and to the source of the transistor M4. The source of the transistor M1 is coupled to the source of the transistor M2 and to the drain of an NMOS transistor M5. The gate of the transistor M5 is biased by a voltage VBIAS. The source of the transistor M5 is coupled to a negative supply voltage −VSS.

The transistors M1, M2, M3, and M4 form an input stage of the operational amplifier. The transistors M1 and M2 are a source-coupled input pair and the transistors M3 and M4 form an active load. Because the transistors M3 and M4 ideally have the same ratio of width-to-length (W/L) and the same gate-to-source voltage and because the gate of the transistor M3 is coupled to its drain, M3 and M4 form a current mirror. The transistor M5 serves to bias the transistors M1, M2, M3 and M4 of the input stage.

When a voltage applied to the gate of the transistor M1 is reduced by an amount equal to Δv divided by two and the voltage applied to the gate of the transistor M2 is increased by an amount equal to Δv divided by two, this causes the voltage at the drain of the transistor M2 to drop by an amount equal to Δv multiplied by A (where A is the voltage gain of the input stage). Thus, a differential-to-single ended conversion takes place in the input stage.

The drain of the transistor M2 is coupled to the gate of a PMOS transistor M6. The source of the transistor M6 is coupled to the positive supply voltage VDD. The drain of the transistor M6 is coupled to the drain of an NMOS transistor M7, forming an output node VOUT. The gate of the transistor M7 is coupled to the bias voltage VBIAS and the source of the transistor M7 is coupled to the negative supply voltage −VSS.

The transistor M6 forms an output stage for the operational amplifier and the transistor M7 serves to bias the transistor M6. When the voltage at the gate of the transistor M6 drops by an amount equal to Δv multiplied by A, the current supplied to a load coupled to the node VOUT is increased by an amount equal to Δv multiplied by A and by gm (where gm is the transconductance of M6).

When there is no input voltage applied across the gates of the transistors M1 and M2 (i.e. the gates are grounded), the output voltage should ideally be at the ground level. Accordingly, the input offset voltage is ideally zero. Therefore, when the gates of M1 and M2 are each coupled to the ground node, the voltage at the drain of the transistor M4 should be equal to a voltage required at the gate of the transistor M6 to maintain the output node VOUT at the ground level. To ensure this, the width-to-length ratios of the transistors M3, M4, M5, M6 and M7 must conform to the following:

$$\frac{(W/L) \text{ of } M3}{(W/L) \text{ of } M6} = \frac{(W/L) \text{ of } M4}{(W/L) \text{ of } M6} = \frac{1}{2} \frac{(W/L) \text{ of } M5}{(W/L) \text{ of } M7}$$

To ensure that these relationships hold, variations in the transistor dimensions caused by limited photolithographic resolution can only be reduced by increasing the dimensions. Therefore, the lengths should be relatively large. To achieve high speed for the operational amplifier, however, the lengths should be minimized. Therefore, this prior art operational amplifier has a drawback in that there is a tradeoff between a low input offset voltage and high speed.

What is needed is an operational amplifier wherein device dimensions can be selected to minimize the input offset voltage while not having to compromise the speed of the operational amplifier.

SUMMARY OF THE INVENTION

The invention is an operational amplifier having an input stage and an output stage. The input stage includes first and second source-coupled NMOS input transistors for accepting a differential input voltage across their gates. The input stage also includes first and second PMOS load transistors, each coupled as a current source to supply current to each input transistor from a positive supply voltage. The gate of a third PMOS transistor is coupled to a node between the first input transistor and the first load transistor. The source of the third PMOS transistor is coupled to the positive supply voltage. The drain of the third PMOS transistor is coupled to the sources of the input transistors. The drain of a first NMOS biasing transistor is coupled to the sources of the input transistors and to the drain of the third PMOS transistor. The source of the first biasing transistor is coupled to a negative supply voltage and the gate of the first biasing transistor is coupled to receive a biasing voltage.

A single-ended voltage representative of the differential input voltage is formed at a node between the second input transistor and the second load transistor. The single ended voltage changes from its quiescent value by amount equal to the gain of the input stage multiplied by the differential input voltage.

The output stage includes a fourth PMOS transistor having its gate coupled to receive the single-ended voltage. The source of the fourth PMOS transistor is coupled to the positive supply voltage. The drain of the fourth PMOS transistor is coupled to the drain of a second NMOS biasing transistor, forming an output node. The source of the second biasing transistor is coupled to the negative supply voltage and the gate of the second biasing transistor is coupled to receive the biasing voltage.

To minimize the input offset voltage, a ratio of the width-to-length of the third PMOS transistor to the width-to-length of the fourth PMOS transistor must be equal to a ratio of the drain current in the third PMOS transistor to the drain current in the fourth PMOS transistor under zero input conditions. The gain of the operational amplifier is dependent upon the dimensions of the load transistors, whereas, the speed of the operational amplifier is dependent upon the dimensions of the third and fourth PMOS transistors. The ratio of quiescent drain currents, however, can be controlled by varying bias voltages and/or parameters of other devices in the operational amplifier. Therefore, the load transistors can have relatively large lengths for high gain and the third and fourth PMOS transistors have relatively small lengths for high speed. Therefore, the operational amplifier has low input offset voltage, high speed, high gain and minimal device sizes.

DETAILED DESCRIPTION OF THE PREFERRED EMBODIMENT

Figure 1:
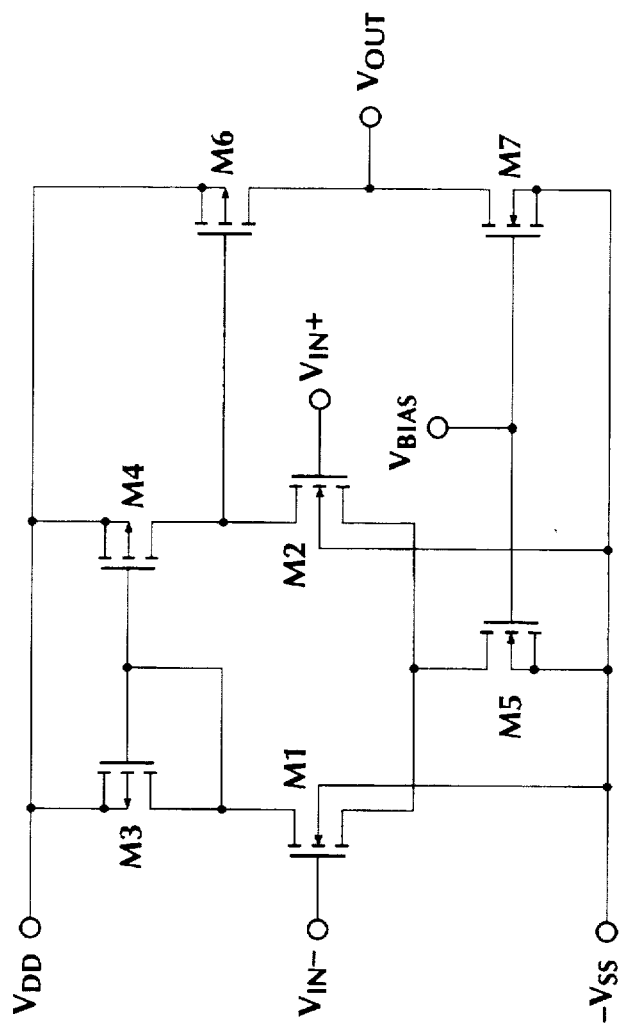
FIG. 1 illustrates a schematic diagram of a prior art operational amplifier.
Figure 2:
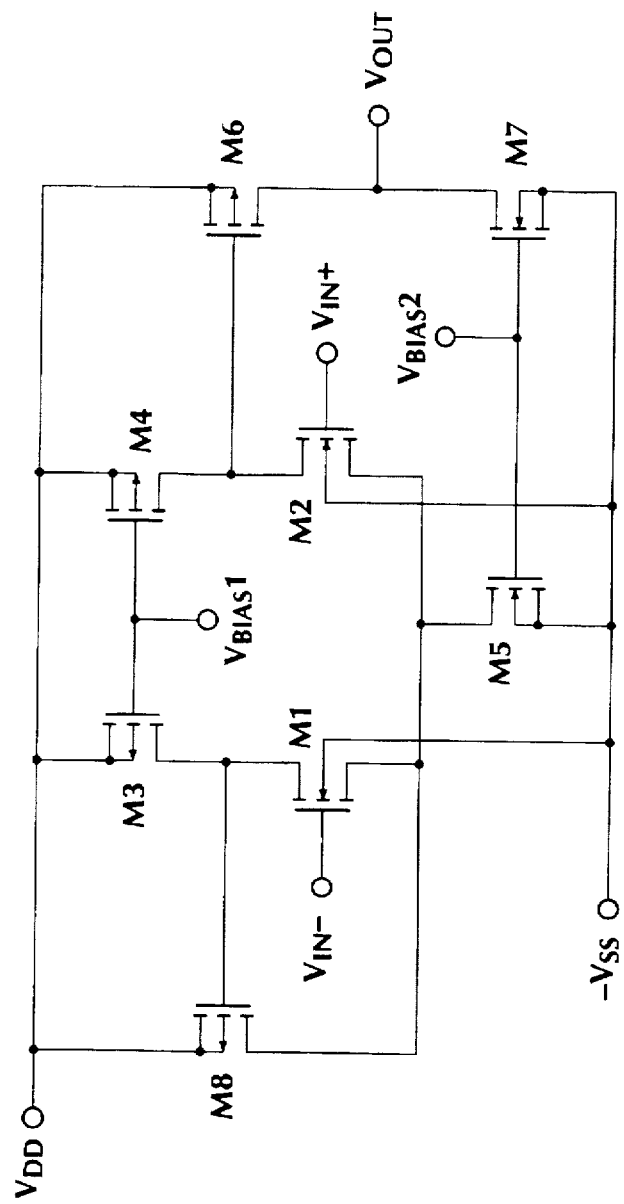
FIG. 2 illustrates a schematic diagram of an operational amplifier of the present invention.

FIG. 2 illustrates a schematic diagram of an operational amplifier of the present invention. A differential input voltage can be applied across the gates of NMOS transistors M1 and M2. The drain of the transistor M1 is coupled to the drain of a PMOS transistor M3 and to the gate of a PMOS transistor M8. The drain of the transistor M2 is coupled to the drain of a PMOS transistor M4. A positive supply voltage VDD is applied to the source of the transistor M3, to the source of the transistor M4 and to the source of the transistor M8. A biasing voltage VBIAS1 is coupled to bias the gate of the transistor M3 and the gate of the transistor M4. The source of the transistor M1 is coupled to the source of the transistor M2, to the drain of the transistor M8 and to the drain of an NMOS transistor M5. The gate of the transistor M5 is biased by a voltage VBIAS2. The source of the transistor M5 is coupled to a negative supply voltage −VSS.

The transistors M1, M2, M3, M4 and M8 form an input stage of the operational amplifier. The transistors M1 and M2 form a source-coupled input pair and the transistors M3 and M4 form an active load. The transistors M3 and M4 each supply a constant and equal current. The transistor M5 serves as a current source for biasing the transistors of the input stage.

When a voltage applied to the gate of the transistor M1 is increased by an amount equal to $\Delta v$ divided by two and the voltage applied to the gate of the transistor M2 is decreased by an amount equal to $\Delta v$ divided by two, the transistor M8 causes the voltage at the sources of the transistors M1 and M2 to rise by an amount equal to $\Delta v$ divided by two. This is because the current through the transistor M1 is fixed by the two current sources (transistors M3 and M5, each of which have constant bias voltages). Therefore, an increase in the gate voltage $V_g$ requires a corresponding increase in the source voltage $V_s$. Accordingly, the gate to source voltage for the transistor M2 changes by and amount $\Delta v$. As such, the current through the transistor M2 also changes by gm $\Delta v$. This incremental current flows through the transistor M8 to complete the current loop. The gate to source voltage $V_{gs}$ of the transistor M2 drops by an amount equal to $\Delta v$. Thus, the drain voltage $V_d$ increases by $\Delta v$ multiplied by A (where A is the voltage gain of the input stage). Thus, a differential-to-single ended conversion takes place in the input stage.

The drain of the transistor M2 is coupled to the gate of a PMOS transistor M6. The source of the transistor M6 is coupled to the positive supply voltage VDD. The drain of the transistor M6 is coupled to the drain of an NMOS transistor M7, forming an output node VOUT. The gate of the transistor M7 is coupled to the biasing voltage VBIAS2 and the source of the transistor M7 is coupled to the negative supply voltage −VSS.

The transistor M6 forms an output stage for the operational amplifier and the transistor M7 serves as a current source for biasing the transistor M6. When the voltage at the gate of the transistor M6 drops by an amount equal to $\Delta v$ multiplied by A, the current supplied to a load coupled to the node VOUT is increased by an amount equal to $\Delta v$ multiplied by A and by gm (where gm is the transconductance of M6).

Stability of the input stage is enhanced because the transistor M8 will have a faster response time that the transistor M1. This is true because the mobility of electrons is greater than the mobility of holes. Stability of the amplifier may be improved, however, by coupling a first terminal of a capacitor to the output node and coupling a second terminal of the capacitor to the gate of the transistor M6 through a resistor.

Under quiescent conditions, when there is no input voltage applied across the gates of the transistors M1 and M2 (i.e. the gates are grounded), the output voltage should ideally be at the ground level. Accordingly, the input offset voltage is ideally zero. Therefore, when the gates of M1 and M2 are each coupled to the ground node, the voltage at the drain of the transistor M4 should be equal to a voltage required at the gate of the transistor M6 to maintain the output node VOUT at the ground level. To ensure this, the quiescent drain currents of the transistors M6 and M8 and the width-to-length ratios of the transistors M6 and M8 must conform to the following:

$$\frac{(W/L) \text{ of } M6}{(W/L) \text{ of } M8} = \frac{(Id) \text{ of } M6}{(Id) \text{ of } M8}$$

The gain of the operational amplifier is dependent upon the dimensions of the transistors M3 and M4, whereas, the speed of the operational amplifier is dependent upon the dimensions of the transistors M6 and M8. Preferably, the transistors M3 and M4 have relatively large lengths for a high gain, while the transistors M6 and M8 have relatively small lengths for high speed. Also, the transistor M3 preferably has the same width-to-length ratio as the transistor M4. The quiescent drain currents of M6 and M8, however, can be controlled by varying the bias voltages VBIAS1 and VBIAS2 and/or the parameters of devices in the operational amplifier other than M3, M4, M6 and M8, such as the dimensions of the transistor M5 or the transistor M7. Therefore, the operational amplifier can simultaneously achieve low input offset voltage, high speed and high gain.

Figure 3:
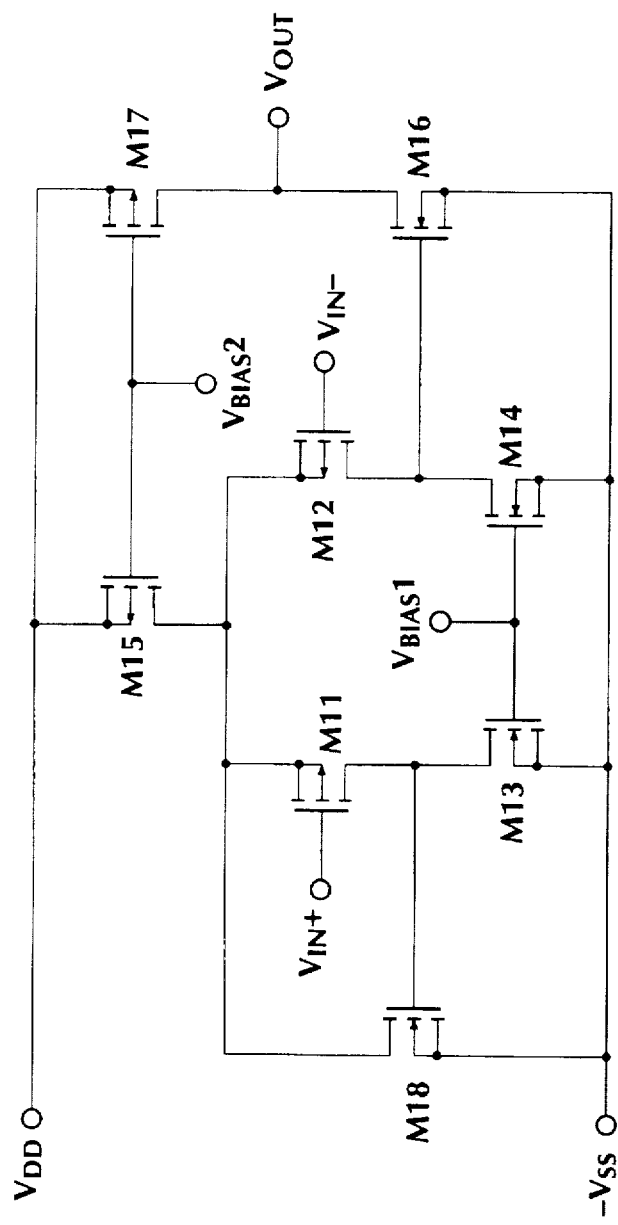
FIG. 3 illustrates a schematic diagram of an operational amplifier of the present invention that is complementary to the operational amplifier illustrated in FIG. 2.

FIG. 3 illustrates a schematic diagram of an operational amplifier of the present invention that is complementary to the operational amplifier illustrated in FIG. 2. The circuit illustrated in FIG. 3 is related to the circuit illustrated in FIG. 2 in that each NMOS transistor is replaced with a PMOS transistor and each PMOS transistor is replaced with an NMOS transistor and the supply voltage polarities are reversed.

A differential input voltage can be applied across the gates of PMOS transistors M11 and M12. The drain of the transistor M11 is coupled to the drain of an NMOS transistor M14 and to the gate of an NMOS transistor M18. The drain of the transistor M12 is coupled to the drain of an NMOS transistor M14. A negative supply voltage −VSS is applied to the source of the transistor M13, to the source of the transistor M14 and to the source of the transistor M18. A biasing voltage VBIAS1 is coupled to bias the gate of the transistor M13 and to the gate of the transistor M14. The source of the transistor M11 is coupled to the source of the transistor M12, to the drain of the transistor M18 and to the drain of a PMOS transistor M15. The gate of the transistor M15 is biased by a voltage VBIAS2. The source of the transistor M15 is coupled to a positive supply voltage VDD.

The drain of the transistor M12 is coupled to the gate of an NMOS transistor M16. The source of the transistor M16 is coupled to the negative supply voltage −VSS. The drain of the transistor M16 is coupled to the drain of a PMOS transistor M17, forming an output node VOUT. The gate of the transistor M17 is coupled to the bias voltage VBIAS2 and the source of the transistor M17 is coupled to the positive supply voltage VDD.

It will be apparent that circuit illustrated in FIG. 3 functions analogously to the circuit illustrated in FIG. 2. The circuit illustrated in FIG. 2 is preferred, however, because in FIG. 2, the transistor M2 is ensured to be faster responding than the transistor M8 due to the relative mobilities of holes and electrons, whereas, in the circuit of FIG. 3, the transistor M18 could be faster than the transistor M11. Stability of the amplifier illustrated in FIG. 3 may be improved by including a capacitor coupled from the output node to the gate of the transistor M6 through a resistor.

Integrated circuits can be manufactured that combine devices of one technology, such as NMOS, with devices of another technology, such as PMOS, in a single integrated circuit (referred to as CMOS). In addition, bipolar devices can be combined with NMOS and/or PMOS devices in a single integrated circuit (referred to as BiMOS). Therefore, devices utilized in an operational amplifier can be selected without regard to whether a particular device is NMOS, PMOS or bipolar. For example, the operational amplifier of the present invention can include PMOS or NMOS input devices, as illustrated in FIGS. 2 and 3, taking advantage of their lack of a quiescent current into the gate, or can include bipolar devices, taking advantage of their high gain values, as illustrated in FIG. 4.

Figure 4:
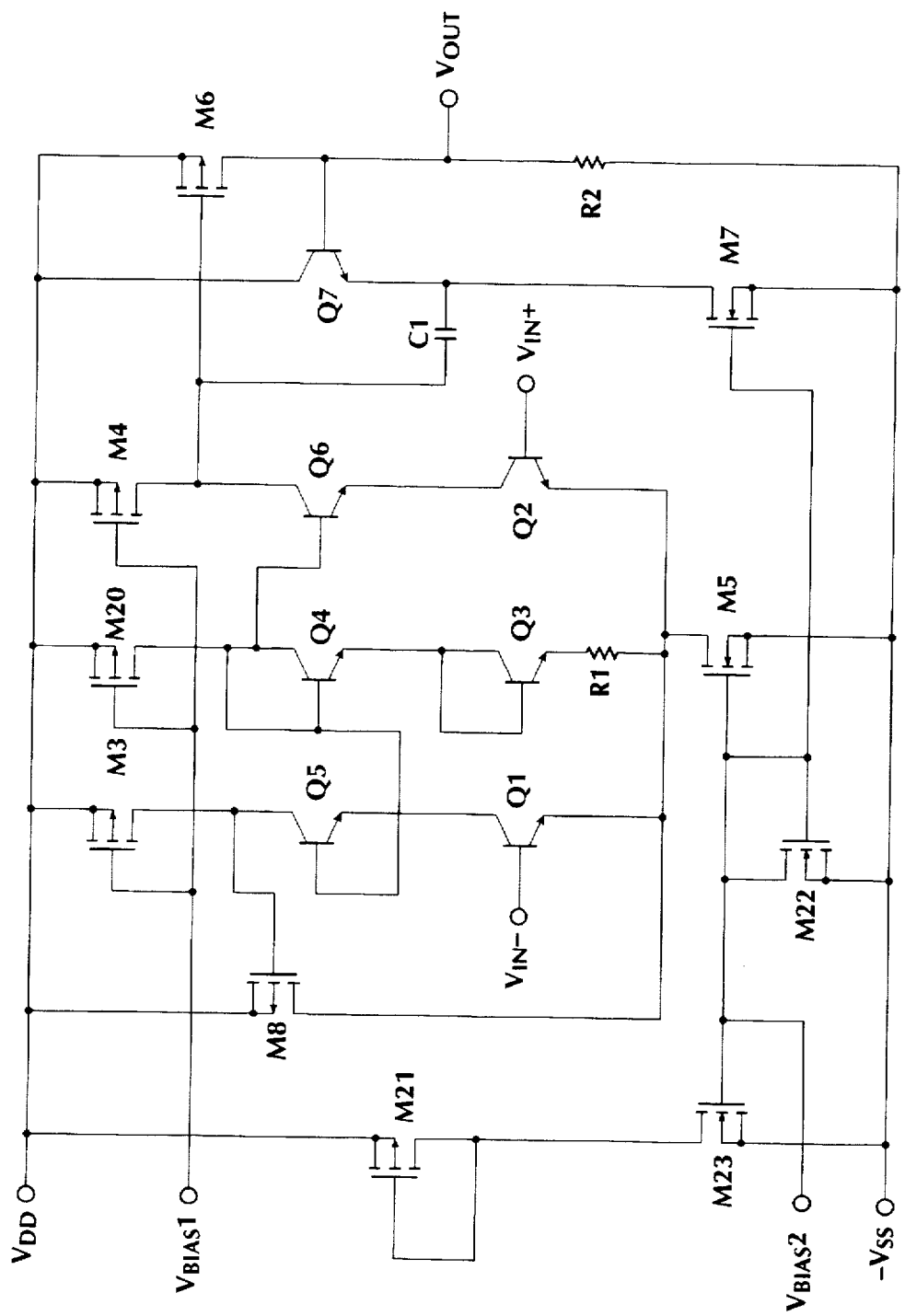
FIG. 4 illustrates a schematic diagram of a BiMOS operational amplifier of the present invention.

FIG. 4 illustrates a schematic diagram of a BiMOS operational amplifier of the present invention. It is anticipated that the operational amplifier illustrated in FIG. 4 will be available in an integrated circuit package under part number ML2037 from Micro Linear Corporation, located at 2092 Concourse Drive, in San Jose, Calif. Like reference numerals are used in FIG. 4 for circuit elements that have a one-to-one functional correspondence to the elements of FIG. 2. A differential input voltage can be applied across the bases of npn bipolar input transistors Q1 and Q2. The transistors Q1 and Q2 correspond to transistors M1 and M2 illustrated in FIG. 2, respectively, except that the transistors Q1 and Q2 are npn bipolar transistors, whereas, the transistors M1 and M2 are NMOS transistors. An emitter of the transistor Q1 is coupled to an emitter of the transistor Q2, to the drain of a PMOS transistor M8, to a first terminal of a resistor R1 and to the drain of an NMOS transistor M5. The transistors Q1 and Q2 form an emitter-coupled pair.

A second terminal of the resistor R1 is coupled to an emitter of an npn bipolar transistor Q3. A base of the transistor Q3 is coupled to a collector of the transistor Q3 and to an emitter of an npn bipolar transistor Q4. A collector of the transistor Q1 is coupled to an emitter of an npn bipolar transistor Q5. A collector of the transistor Q2 is coupled to an emitter of the transistor Q6. A base of the transistor Q5 is coupled to a base of the transistor Q4, to a base of the transistor Q6, to a collector of the transistor Q4 and to the drain of a PMOS transistor M20.

A collector of the transistor Q5 is coupled to the gate of a transistor M8 and to the drain of a PMOS transistor M3. A collector of the transistor Q6 is coupled to the gate of a PMOS transistor M6, to the drain of a PMOS transistor M4 and to a first terminal of a capacitor C1. A biasing voltage VBIAS1 is coupled to the gate of the transistor M3, to the gate of the transistor M20 and to the gate of the transistor M4. A positive supply voltage VDD is coupled to the source of the transistor M8, to the source of the transistor M3, to the source of the transistor M20, to the source of the transistor M4, to the source of the transistor M6, to a collector of an npn bipolar transistor Q7 and to the source of a PMOS transistor M21.

The drain of the transistor M6 is coupled to a base of the transistor Q7, to an output node VOUT and to a first terminal of a resistor R2. An emitter of the transistor Q7 is coupled to a second terminal of the capacitor C1 and to the drain of a transistor M7. A negative supply voltage −VSS is coupled to a second terminal of the resistor R2, to the source of the transistor M7, to the source of the transistor M5, to the source of an NMOS transistor M22 and to the source of an NMOS transistor M23. The drain of the transistor M23 is coupled to the drain of the transistor M21 and to the gate of the transistor M21. A biasing voltage VBIAS2 is coupled to the gate of the transistor M23, to the drain of the transistor M22, to the gate of the transistor M22, to the gate of the transistor M5 and to the gate of the transistor M7.

Stability in the operational amplifier is improved by the capacitor C1 which serves as a compensation element. The transistor Q7 serves to remove a zero from the right half plane of the Laplace transfer function for the operational amplifier. The bipolar transistors Q3, Q4, Q5, Q6 and the PMOS transistor M20 have been added for biasing the input transistors Q1 and Q2. It will be apparent that parameters of elements illustrated in FIG. 4 can affect the value of the drain currents of the transistors M6 and M8 for ensuring that the operational amplifier has a low input offset voltage. It will also be apparent that the input transistors M1 and M2 illustrated in FIG. 3 could be replaced with pnp bipolar transistors with appropriate modifications, such as the inclusion of additional transistors for biasing the pnp bipolar transistors.

Preferably, the transistors M3, M4 and M20 each have a width of 160 µm and a length of 8 µm. Therefore, the transistors M3, M4 and M20 each have a width-to-length ratio of 20. Preferably, the transistors M6 and M8 each have a width of 72 µm and a length of 1.5 µm. Therefore, the transistors M6 and M8 each have width-to-length ratio of 48. Preferably, the transistors M5 and M7 each have a width of 9.5 µm and a length of 4 µm. Therefore, the transistors M5 and M7 each have a width-to-length ratio of 2.375.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. For example, it will be apparent that one or more of the width or length dimensions disclosed herein can be altered.

What is claimed is:

1. An operational amplifier comprising:
   a. an input stage having a first input transistor and a second input transistor wherein the first input transistor is coupled to the second input transistor, the first input transistor and the second input transistor for accepting a differential input voltage and the input stage having a third transistor coupled to the first input transistor wherein the third transistor has a first width-to-length ratio and a first quiescent current level and the input stage having first and second biasing transistors, the first biasing transistor for biasing the first input transistor with a first constant current and the second biasing transistor for biasing the second input transistor with a second constant current wherein a control terminal of each of the first and second biasing transistors is coupled to receive a first constant biasing voltage; and
   b. an output transistor coupled to the input stage wherein the output transistor has a second width-to-length ratio and a second quiescent current level wherein a ratio of the first width-to-length ratio to the second width-to-length ratio is equal to a ratio of the first quiescent current level to the second quiescent current level whereby the operational amplifier has substantially no input offset voltage.

2. A differential-to-single ended operational amplifier comprising:
   a. a differential input stage having a first input transistor and a second input transistor coupled for receiving a differential voltage, wherein each of the first input transistor and the second input transistor have three nodes including an input node, an output node and a common node such that both the first input transistor and the second input transistor are coupled to share the common node and the input stage having first and second biasing transistors, the first biasing transistor coupled to the output node of the first input transistor for biasing the first input transistor with a first constant current and the second biasing transistor coupled to the output node of the second input transistor for biasing the second input transistor with a second constant current wherein a control terminal of each of the first and second biasing transistors is coupled to receive a constant biasing voltage;
   b. a single ended output coupled to receive an amplified differential signal; and
   c. a circuit for adjusting a voltage level on the common node in response to a change in the differential voltage.

3. The differential-to-single ended operational amplifier according to claim 2 wherein a change in the voltage level on the common node is equal to one-half the change in the differential voltage.

4. A differential-to-single ended operational amplifier comprising:
   a. a differential input having a first input transistor and a second input transistor coupled for receiving a differential voltage, wherein each of the first input transistor and the second input transistor have three nodes including an input node, an output node and a shared common node;
   b. a single ended output coupled to receive an amplified difference signal from the output node of the second input transistor; and
   c. a third transistor having an input terminal and an output terminal wherein the input terminal of the third transistor is controlled by the output terminal of the first transistor and the output terminal of the third transistor is coupled to the common node for adjusting a voltage level on the common node in response to a change in a voltage on the input node of the first input transistor.

5. The differential-to-single ended operational amplifier according to claim 4 wherein a change in the voltage level on the common node is equal to the change in the voltage on the input node of the first transistor.

6. The differential-to-single ended operational amplifier according to claim 5 further comprising a circuit for maintaining a constant current through the first input transistor.

7. An operational amplifier comprising:
   a. a first NMOS transistor having a gate, a source and a drain wherein the source of the first NMOS transistor is coupled to a first node;
   b. a second NMOS transistor having a gate, a source and a drain, wherein the source of the second NMOS transistor is coupled to the first node;
   c. a first current source, wherein the first current source is coupled to provide a first current from a second node to the drain of the first NMOS transistor;
   d. a second current source, wherein the second current source is coupled to provide a second current from the second node to the drain of the second NMOS transistor;
   e. a first PMOS transistor having a gate, a source and a drain, wherein the gate of the first PMOS transistor is coupled to the drain of the first NMOS transistor and the drain of the first PMOS transistor is coupled to the first node and wherein the source of the third PMOS transistor is coupled to the second node; and f. first means for biasing coupled to the first node.

8. The operational amplifier according to claim 7 further comprising:
   a. a second PMOS transistor having a gate, a drain and a source wherein the gate of the second PMOS transistor is coupled to the drain of the second NMOS transistor, the source of the second PMOS transistor is coupled to the second node; and
   b. second means for biasing coupled to the drain of the second PMOS transistor.

9. The operational amplifier according to claim 8 wherein the first PMOS transistor has a first width-to-length ratio and a first quiescent current level and the second PMOS transistor has a second width-to-length ratio and a second quiescent current level wherein a ratio of the first width-to-length ratio to the second width-to-length ratio is substantially equal to a ratio of the first quiescent current level to the second quiescent current level.

10. The operational amplifier according to claim 9 wherein the ratio of the first width-to-length ratio to the second width-to-length ratio is substantially equal one.

11. The operational amplifier according to claim 9 wherein the first current source is third PMOS transistor and the second current source is a fourth PMOS transistor.

12. The operational amplifier according to claim 11 wherein the first means for biasing is a third current source and the second means for biasing is a fourth current source.

13. The operational amplifier according to claim 12 wherein the third current source is third NMOS transistor and the fourth current source is fourth NMOS transistor.

14. An operational amplifier comprising:
   a. a first npn bipolar transistor having a base, an emitter and a collector, wherein the emitter of the first bipolar transistor is coupled to a first node;
   b. a second npn bipolar transistor having a base, an emitter and a collector, wherein the emitter of the second bipolar transistor is coupled to the first node;
   c. a first current source, wherein the first current source is coupled to provide a first current from a second node to the collector of the first bipolar transistor;
   d. a second current source, wherein the second current source is coupled to provide a second current from the second node to the collector of the second bipolar transistor;
   e. a first PMOS transistor having a gate, a drain and a source, wherein the gate of the first MOS transistor is coupled to the collector of the first bipolar transistor, the drain of the first PMOS transistor is coupled to the first node and wherein the source of the first PMOS transistor is coupled to the second node; and
   f. first means for biasing coupled to the first node.

15. The operational amplifier according to claim 14 further comprising:
   a. a second PMOS transistor having a gate, a drain and a source wherein the gate of the second PMOS transistor is coupled to the collector of the second npn bipolar transistor, the source of the second PMOS transistor is coupled to the second node; and
   b. second means for biasing coupled to the drain of the second PMOS transistor.

16. The operational amplifier according to claim 15 wherein the first PMOS transistor has a first width-to-length ratio and a first quiescent current level and the second PMOS transistor has a second width-to-length ratio and a second quiescent current level wherein a ratio of the first width-to-length ratio to the second width-to-length ratio is substantially equal to a ratio of the first quiescent current level to the second quiescent current level.

17. The operational amplifier according to claim 16 wherein the ratio of the first width-to-length ratio to the second width-to-length ratio is substantially equal one.

18. The operational amplifier according to claim 16 wherein the first current source is third PMOS transistor and the second current source is a fourth PMOS transistor.

19. The operational amplifier according to claim 18 wherein the first means for biasing is a third current source and the second means for biasing is a fourth current source.

20. The operational amplifier according to claim 19 wherein the third current source is first NMOS transistor and the fourth current source is a second NMOS transistor.

21. An operational amplifier comprising:
   a. a first PMOS transistor having a gate, a source and a drain wherein the source of the first PMOS transistor is coupled to a first node;
   b. a second PMOS transistor having a gate, a source and a drain, wherein the source of the second PMOS transistor is coupled to the first node;
   c. a first current source, wherein the first current source is coupled to provide a first current from the drain of the first PMOS transistor to a second node;
   d. a second current source, wherein the second current source is coupled to provide a second current from the drain of the second PMOS transistor to the second node;
   e. a first NMOS transistor having a gate, a source and a drain, wherein the gate of the first NMOS transistor is coupled to the drain of the first PMOS transistor and the drain of the first NMOS transistor is coupled to the first node and wherein the source of the third NMOS transistor is coupled to the second node; and
   f. first means for biasing coupled to the first node.

22. The operational amplifier according to claim 21 further comprising:
   a. a second NMOS transistor having a gate, a drain and a source wherein the gate of the second NMOS transistor is coupled to the drain of the second PMOS transistor, the source of the second NMOS transistor is coupled to the second node; and
   b. second means for biasing coupled to the drain of the second NMOS transistor.

23. The operational amplifier according to claim 22 wherein the first NMOS transistor has a first width-to-length ratio and a first quiescent current level and the second NMOS transistor has a second width-to-length ratio and a second quiescent current level wherein a ratio of the first width-to-length ratio to the second width-to-length ratio is substantially equal to a ratio of the first quiescent current level to the second quiescent current level.

24. The operational amplifier according to claim 23 wherein the ratio of the first width-to-length ratio to the second width-to-length ratio is substantially equal one.

25. The operational amplifier according to claim 23 wherein the first current source is third NMOS transistor and the second current source is a fourth NMOS transistor.

26. The operational amplifier according to claim 25 wherein the first means for biasing is a third current source and the second means for biasing is a fourth current source.

27. The operational amplifier according to claim 26 wherein the third current source is third PMOS transistor and the fourth current source is fourth PMOS transistor.

28. An operational amplifier comprising:

a. a first pnp bipolar transistor having a base, an emitter and a collector, wherein the emitter of the first bipolar transistor is coupled to a first node;

b. a second pnp bipolar transistor having a base, an emitter and a collector, wherein the emitter of the second bipolar transistor is coupled to the first node;

c. a first current source, wherein the first current source is coupled to provide a first current from the collector of the first bipolar transistor to a second node;

d. a second current source, wherein the second current source is coupled to provide a second current from the collector of the second bipolar transistor to the second node;

e. a first NMOS transistor having a gate, a drain and a source, wherein the gate of the first NMOS transistor is coupled to the collector of the first bipolar transistor, the drain of the first NMOS transistor is coupled to the first node and wherein the source of the first NMOS transistor is coupled to the second node; and f. first means for biasing coupled to the second node.

29. The operational amplifier according to claim 28 further comprising:

a. a second NMOS transistor having a gate, a drain and a source wherein the gate of the second NMOS transistor is coupled to the collector of the second npn bipolar transistor, the source of the second NMOS transistor is coupled to the second node; and b. second means for biasing coupled to the drain of the second NMOS transistor.

30. The operational amplifier according to claim 29 wherein the first NMOS transistor has a first width-to-length ratio and a first quiescent current level and the second NMOS transistor has a second width-to-length ratio and a second quiescent current level wherein a ratio of the first width-to-length ratio to the second width-to-length ratio is substantially equal to a ratio of the first quiescent current level to the second quiescent current level.

31. The operational amplifier according to claim 30 wherein the ratio of the first width-to-length ratio to the second width-to-length ratio is substantially equal one.

32. The operational amplifier according to claim 30 wherein the first current source is third NMOS transistor and the second current source is a fourth NMOS transistor.

33. The operational amplifier according to claim 32 wherein the first means for biasing is a third current source and the second means for biasing is a fourth current source.

34. The operational amplifier according to claim 33 wherein the third current source is first PMOS transistor and the fourth current source is a second PMOS transistor.

35. An operational amplifier comprising:

a. a first npn bipolar transistor having a base, an emitter and a collector;

b. a second npn bipolar transistor having a base, an emitter and a collector, wherein the emitter of the second npn bipolar transistor is coupled to the emitter of the first npn transistor;

c. a first resistor having a first terminal and a second terminal wherein the first terminal is coupled to the emitter of the first npn bipolar transistor and to the emitter of the second npn bipolar transistor;

d. a third npn bipolar transistor having a base, an emitter and a collector wherein the emitter of the third npn bipolar transistor is coupled to the second terminal of the first resistor;

e. a fourth npn bipolar transistor having a base, an emitter and a collector, wherein the emitter of the fourth npn bipolar transistor is coupled to the collector of the third npn bipolar transistor and to the base of the third npn bipolar transistor;

f. a fifth npn bipolar transistor having a base, an emitter and a collector wherein the emitter of the fifth npn bipolar transistor is coupled to the collector of the first npn bipolar transistor;

g. a sixth npn bipolar transistor having a base, an emitter and a collector wherein the emitter of the sixth bipolar transistor is coupled to the collector of the second npn bipolar transistor;

h. a first PMOS transistor having a gate, a drain and a source wherein the drain of the first PMOS transistor is coupled to the collector of the fourth npn bipolar transistor, to the base of the fourth npn bipolar transistor, to the base of the fifth npn bipolar transistor and to the base of the sixth npn bipolar transistor and wherein the gate of the first PMOS transistor is coupled to the first biasing voltage;

i. a second PMOS transistor having a gate, a drain and a source wherein the drain of the second PMOS transistor is coupled to the collector of the fifth npn bipolar transistor and wherein the gate of the second PMOS transistor is coupled to the first biasing voltage;

j. a third PMOS transistor having a gate, a drain and a source wherein the drain of the third PMOS transistor is coupled to the collector of the sixth npn bipolar transistor and wherein the gate of the third PMOS transistor is coupled to the first biasing voltage;

k. a fourth PMOS transistor having a gate, a drain and a source wherein the gate of the fourth PMOS transistor is coupled to the drain of the second PMOS transistor and to the collector of the fifth npn bipolar transistor;

l. a first NMOS transistor having a gate, a drain and a source wherein the drain of the first NMOS transistor is coupled to the drain of the fourth PMOS transistor, to the emitter of the first npn bipolar transistor, to the first terminal of the first resistor and to the emitter of the second npn bipolar transistor and wherein the gate of the first NMOS transistor is coupled to a second biasing voltage;

m. a fifth PMOS transistor having a gate, a drain and a source wherein the gate of the fifth bipolar transistor is coupled to the drain of the third PMOS transistor and to the collector of the sixth npn bipolar transistor;

n. a capacitor having a first terminal and a second terminal wherein the first terminal of the capacitor is coupled to the gate of the fifth PMOS transistor, to the drain of the third PMOS transistor and to the collector of the sixth npn bipolar transistor;

o. a seventh npn bipolar transistor having a base, an emitter and a collector wherein the base of the seventh npn bipolar transistor is coupled to the drain of the fifth PMOS transistor and wherein the collector of the seventh npn bipolar transistor is coupled to a first supply voltage, to the source of the first PMOS transistor, to the source of the second PMOS transistor, to the source of the third PMOS transistor, to the source of the fourth PMOS transistor and to the source of the fifth PMOS transistor;

p. a second NMOS transistor having a gate, a drain and a source wherein the drain is coupled to the second terminal of the capacitor and to the emitter of the seventh npn bipolar transistor and wherein the gate of the second NMOS transistor is coupled to the second biasing voltage; and q. a second resistor having a first terminal and a second terminal wherein the first terminal of the second resistor is coupled to the drain of the fifth PMOS transistor and to the base of the seventh npn bipolar transistor and wherein the second terminal of the second resistor is coupled to a second supply voltage, to the source of the first NMOS transistor and to the source of the second NMOS transistor.

36. The operational amplifier according to claim 1 further comprising a third biasing transistor coupled to a node common to the first and second input transistors wherein a control terminal of the third biasing transistor is coupled to receive a second constant biasing voltage.

* * * * *